United States Patent
Tsunetomo et al.

(10) Patent No.: US 10,727,048 B2
(45) Date of Patent: Jul. 28, 2020

(54) METHOD FOR PRODUCING GLASS SUBSTRATE WITH THROUGH GLASS VIAS AND GLASS SUBSTRATE

(71) Applicant: Nippon Sheet Glass Company, Limited, Tokyo (JP)

(72) Inventors: Keiji Tsunetomo, Kanagawa (JP); Hideki Hashizume, Tokyo (JP); Kazuya Ohkawa, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/248,145

(22) Filed: Jan. 15, 2019

(65) Prior Publication Data

US 2019/0148142 A1 May 16, 2019

Related U.S. Application Data

(63) Continuation of application No. 15/516,266, filed as application No. PCT/JP2015/004952 on Sep. 29, 2015, now Pat. No. 10,276,368.

(30) Foreign Application Priority Data

Oct. 3, 2014 (JP) ................................. 2014-204957

(51) Int. Cl.
*H01L 21/02* (2006.01)
*C03C 15/00* (2006.01)
(Continued)

(52) U.S. Cl.
CPC .... *H01L 21/02422* (2013.01); *B23K 26/0006* (2013.01); *B23K 26/50* (2015.10);
(Continued)

(58) Field of Classification Search
CPC ................................. H05K 3/108; C03C 15/00
See application file for complete search history.

(56) References Cited

U.S. PATENT DOCUMENTS 5,386,430 A * 1/1995 Yamagishi ........... B23K 26/032
372/57
7,133,737 B2 * 11/2006 Miyanaga .......... G05B 19/4097
700/166
(Continued)

FOREIGN PATENT DOCUMENTS

JP S54126215 A 10/1979
JP 2000061667 A 2/2000
(Continued)

OTHER PUBLICATIONS

Takashi Yoshinaga et al., "Trends in R&D in TSV Technology for 3D LSI Packaging," Science & Technology Trends, Apr. 2010 [Oct. 2010], p. 23-34 [p. 26-39], No. 109 [Quarterly Review No. 37] (both Japanese and English versions included).

(Continued)

*Primary Examiner* — Shamim Ahmed
(74) *Attorney, Agent, or Firm* — Hamre, Schumann, Mueller & Larson, P.C.

(57) ABSTRACT

A method for producing a glass substrate with through glass vias according to the present invention includes: irradiating a glass substrate (10) with a laser beam to form a modified portion; forming a first conductive portion (20a) on a first principal surface of the glass substrate (10), the first conductive portion (20a) being positioned in correspondence with the modified portion (12); and forming a through hole (14) in the glass substrate (10) after formation of the first conductive portion by etching at least the modified portion (12) using an etchant. This method allows easy handling of a glass substrate during formation of a conductive portion such as a circuit on the glass substrate, and is also capable (Continued)

of forming a through hole in the glass substrate relatively quickly while preventing damage to the conductive portion such as a circuit formed on the glass substrate.

3 Claims, 6 Drawing Sheets

(51) Int. Cl.

| | | |
|---|---|---|
| *C03C 17/22* | (2006.01) | |
| *H05K 1/03* | (2006.01) | |
| *H01L 23/15* | (2006.01) | |
| *B23K 26/00* | (2014.01) | |
| *C03C 17/30* | (2006.01) | |
| *H01L 21/48* | (2006.01) | |
| *H05K 3/00* | (2006.01) | |
| *B23K 26/50* | (2014.01) | |
| *H01L 21/768* | (2006.01) | |
| *H01L 23/498* | (2006.01) | |
| *H05K 1/14* | (2006.01) | |
| *B23K 103/00* | (2006.01) | |
| *B23K 101/40* | (2006.01) | |

(52) U.S. Cl.
CPC .............. *C03C 15/00* (2013.01); *C03C 17/30* (2013.01); *H01L 21/486* (2013.01); *H01L 21/76805* (2013.01); *H01L 23/15* (2013.01); *H01L 23/49827* (2013.01); *H05K 1/0306* (2013.01); *H05K 3/002* (2013.01); *H05K 3/0032* (2013.01); *B23K 2101/40* (2018.08); *B23K 2103/54* (2018.08); *C03C 2218/34* (2013.01); *H01L 2924/0002* (2013.01); *H05K 1/141* (2013.01); *H05K 2201/09827* (2013.01); *H05K 2201/10378* (2013.01); *H05K 2203/107* (2013.01)

(56) References Cited

U.S. PATENT DOCUMENTS

| | | | |
|---|---|---|---|
| 2009/0004403 A1* | 1/2009 | Li | H05K 3/0032 |
| | | | 427/556 |
| 2009/0013724 A1 | 1/2009 | Koyo et al. | |
| 2009/0133910 A1* | 5/2009 | Ohashi | H05K 3/0032 |
| | | | 174/258 |
| 2010/0307808 A1 | 12/2010 | Horiuchi et al. | |
| 2010/0330746 A1 | 12/2010 | Mitani | |
| 2011/0056740 A1 | 3/2011 | Takano | |
| 2011/0129999 A1 | 6/2011 | Nukaga et al. | |
| 2011/0232948 A1 | 9/2011 | Sato et al. | |
| 2012/0131958 A1 | 5/2012 | Shimoi et al. | |

FOREIGN PATENT DOCUMENTS

| | | |
|---|---|---|
| JP | 2001105398 A | 4/2001 |
| JP | 2002043723 | 2/2002 |
| JP | 2002066769 A | 3/2002 |
| JP | 2008156200 A | 7/2008 |
| JP | 2009117771 | 5/2009 |
| JP | 2010225664 | 10/2010 |
| JP | 2011178642 A | 9/2011 |
| WO | 2012014710 A1 | 2/2012 |

OTHER PUBLICATIONS

International Search Report for PCT/JP2015/004952, dated Jan. 12, 2016, 5 pages including English translation.

\* cited by examiner

METHOD FOR PRODUCING GLASS SUBSTRATE WITH THROUGH GLASS VIAS AND GLASS SUBSTRATE

This application is a continuation of Ser. No. 15/516,266, filed Mar. 31, 2017, now U.S. Pat. No. 10,276,368, which is a national stage of PCT/JP2015/004952, filed Sep. 29, 2015.

TECHNICAL FIELD

The present invention relates to a method for producing a glass substrate with through glass vias and a glass substrate for producing the glass substrate with through glass vias.

BACKGROUND ART

A known example of conventional mounting techniques for large-scale integration (LSI) is one that uses through silicon via (TSV) technology. Silicon substrates having through silicon vias are widely used, for example, as interposers. An interposer is a substrate that interconnects a pair of circuit boards differing in routing design rule and in terminal pitch such as a pair of an integrated circuit (IC) and a printed board.

There is known a method for forming TSVs in a silicon substrate, in which, as described in Non Patent Literature 1, TSVs are formed before, after, or between the steps of forming elements such as a transistor or forming a circuit including electrodes.

The TSV technology unfortunately requires high cost because this technology uses a silicon substrate, which is expensive, and because it involves, due to the use of silicon which is a semiconductor, an insulation treatment performed before and after the formation of through holes in the silicon substrate. In terms of, for example, cost reduction of interposers, attention has been given to glass substrates with through glass vias (TGVs) which are produced by forming through glass vias in a glass substrate which is inexpensive.

The TGV technology involves the formation of through holes in a glass substrate. A known example of the technique for forming through holes in a glass substrate is one in which, as described in Patent Literature 1, the formation of through holes is accomplished by irradiation with a pulsed YAG laser. Additionally, Patent Literature 2 describes a method for forming minute holes in a photosensitive glass substrate. In the method described in Patent Literature 2, a photomask is placed on a predefined region of the photosensitive glass substrate, and the photosensitive glass substrate is irradiated with ultraviolet light to form a latent image. The photosensitive glass substrate is then heated to crystallize the latent image. Next, a processing target hole smaller than the latent image is formed by laser light at the center of the area where the latent image lies. This is followed by etching using hydrofluoric acid. The crystallized area is thus selectively etched, with the result that a hole is formed. Patent Literature 3 describes a method for perforating a glass sheet from both sides of the glass sheet using a pair of upper and lower coaxial core drills opposed across the glass sheet.

CITATION LIST

Patent Literature

Patent Literature 1: JP 2000-061667 A
Patent Literature 2: JP 2001-105398 A
Patent Literature 3: JP 54-126215 A

Non Patent Literature

Non Patent Literature 1: Takashi Yoshinaga and Minoru Nomura, "Trends of Research and Development of TSV Technology for Three-Dimensional LSI Packaging", Science and Technology Trends, National Institute of Science and Technology Policy, April 2010, No. 109, pp. 23-34.

SUMMARY OF INVENTION

Technical Problem

Formation of through holes in a glass substrate can reduce the mechanical strength of the glass substrate. Thus, if, in production of a glass substrate with through glass vias, a conductive portion such as a circuit is formed on one principal surface of a glass substrate having through holes formed therein, handling of the glass substrate is difficult during formation of the conductive portion such as a circuit on the glass substrate. If through holes are formed in a glass substrate after a conductive portion such as a circuit is formed on one principal surface of the glass substrate, the formation of the through holes in the glass substrate is difficult to achieve by laser irradiation of the glass substrate. This is because heat generated by laser irradiation can damage the conductive portion such as a circuit which has been formed on the glass substrate. For TSV technology, techniques such as Bosch process employing dry etching have been established as methods for forming through holes in a silicon substrate. However, the formation of through holes in a glass substrate by means of dry etching requires a long time and is far from practical.

In view of such circumstances, the present invention aims to provide a method for producing a glass substrate with through glass vias, in which a glass substrate can easily be handled during the formation of a conductive portion such as a circuit on the glass substrate and in which through holes are formed in the glass substrate relatively quickly along with prevention of damage to the conductive portion such as a circuit formed on the glass substrate.

Solution to Problem

The present invention provides a method for producing a glass substrate with through glass vias, including:

a modified portion forming step of irradiating an area of a glass substrate with a laser beam to form a modified portion in the area irradiated with the laser beam;

a first conductive portion forming step of forming a first conductive portion on a first principal surface of the glass substrate having the modified portion formed therein, the first conductive portion being positioned in correspondence with the modified portion;

a through hole forming step of forming a through hole in the glass substrate after the first conductive portion forming step by etching at least the modified portion using an etchant that etches the modified portion at an etching rate higher than an etching rate at which the etchant etches an area of the glass substrate where the modified portion is not formed; and a through glass via forming step of forming a through glass via inside the through hole.

The present invention also provides a glass substrate for producing a glass substrate with through glass vias, including:

a modified portion formed by laser irradiation; and a positioning element for positional adjustment between the modified portion and a conductive portion to be formed on a first principal surface of the glass substrate.

Advantageous Effects of Invention

According to the present invention, a through hole is formed in a glass substrate after the first conductive portion forming step. The glass substrate thus has a high mechanical strength during the first conductive portion forming step. This makes it easy to handle the glass substrate during the formation of a conductive portion such as a circuit on the glass substrate. Furthermore, the formation of the through hole in the glass substrate is accomplished by irradiating the glass substrate with a laser beam to form a modified portion and then by etching the modified portion using an etchant that yields etching rates as defined above. This makes it possible to complete the formation of the through hole in the glass substrate relatively quickly while preventing damage to the conductive portion such as a circuit formed on the glass substrate.

DESCRIPTION OF EMBODIMENTS

Figure 1:
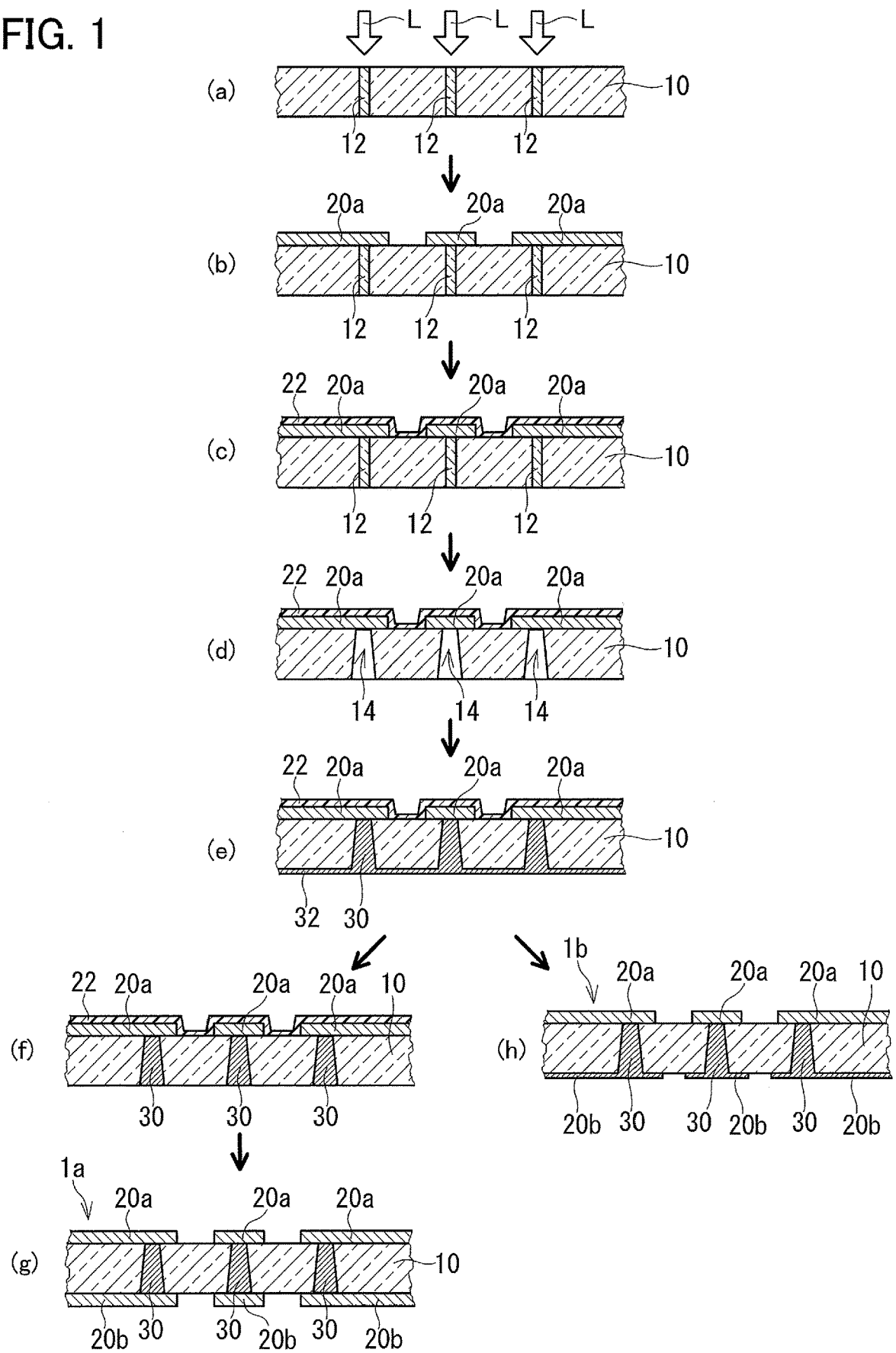
FIG. 1 shows cross-sectional views illustrating the steps of the method for producing a glass substrate with through glass vias according to the first embodiment.

Hereinafter, embodiments of the present invention will be described with reference to the drawings. The following description relates to examples of the present invention, and the present invention is not limited by these examples.

First Embodiment

The method for producing a glass substrate with through glass vias according to the first embodiment includes a modified portion forming step, a first conductive portion forming step, a through hole forming step, and a through glass via forming step. As shown in (a) of FIG. 1, the modified portion forming step is a step of irradiating areas of a glass substrate 10 with laser beams L to form modified portions 12 in the areas irradiated with the laser beams L. As shown in (b) of FIG. 1, the first conductive portion forming step is a step of forming first conductive portions 20a on a first principal surface of the glass substrate 10 having the modified portions 12 formed therein, the first conductive portions 20a being positioned in correspondence with the modified portions 12. As shown in (d) of FIG. 1, the through hole forming step is a step of forming through holes 14 in the glass substrate 10 after the first conductive portion forming step by etching at least the modified portions 12 using an etchant that etches the modified portions 12 at an etching rate higher than an etching rate at which the etchant etches areas of the the glass substrate 10 where the modified portions 12 are not formed. As shown in (e) of FIG. 1, the through glass via forming step is a step of forming through glass vias 30 inside the through holes 14.

The modified portion forming step will first be described. For this step and the etching-based through hole forming step which is a subsequent step described later, methods as described in JP 2008-156200 A can be employed. The laser beams L used in the modified portion forming step are, for example, pulsed laser beams having a certain pulse width. The irradiation with the laser beams L is done, for example, by focusing pulsed laser beams with a wavelength A by a lens and irradiating the glass substrate 10 with the focused laser beams. In this case, the pulse width of the laser beams L is not particularly limited. In terms of reducing the cost of the laser irradiation apparatus used and allowing the laser beams L to have a peak value equal to or higher than a certain value, the pulse width of the laser beams L is, for example, 1 ns (nanosecond(s)) to 200 ns, preferably 1 ns to 100 ns, and more preferably 5 ns to 50 ns.

The laser beams L are, for example, harmonic beams from a Nd:YAG laser, harmonic beams from a Nd:YVO4 laser, or harmonic beams from a Nd:YLF laser. In this case, the harmonic beams are, for example, the second harmonic beams, third harmonic beams, or fourth harmonic beams. The wavelength of the second harmonic beams is around 532 nm to 535 nm, the wavelength of the third harmonic beams is around 355 nm to 357 nm, and the wavelength of the fourth harmonic beams is around 266 nm to 268 nm. The use of such laser beams L allows cost-effective formation of the modified portions 12 in the glass substrate 10.

The wavelength A of the laser beams L is, for example, 535 nm or less, preferably 360 nm or less, and more preferably 350 nm to 360 nm, in terms of reducing the spot size of the laser beams L to a predetermined value or less to achieve the formation of minute through holes in the glass substrate 10.

The energy possessed by the laser beams L is not particularly limited. The energy is preferably adjusted depending on the material of the glass substrate 10 or the size of the modified portions 12 to be formed in the glass substrate 10. The energy possessed by the laser beams L is, for example, 5 μJ/pulse to 100 μJ/pulse. Increasing the energy of the laser beams L leads to a corresponding increase in the length of the modified portions 12. The beam quality $M^2$ of the laser beams L is, for example, 2 or less. In this case, minute through holes can easily be formed in the glass substrate 10.

The absorption coefficient of the glass substrate 10 at the wavelength A is, for example, 50 $cm^{-1}$ or less. In this case, the energy of the laser beams L is less likely to be absorbed in the vicinity of the surface of the glass substrate 10, so that the modified portions 12 are more likely to be formed within the glass substrate 10. The absorption coefficient of the glass substrate 10 at the wavelength A is preferably 0.1 $cm^{-1}$ to 20 $cm^{-1}$. It should be understood that even if the absorption coefficient of the glass substrate 10 at the wavelength λ is less than 0.1 $cm^{-1}$, the modified portions 12 can be formed within the glass substrate 10. A glass having an absorption coefficient of 50 $cm^{-1}$ or less at the wavelength λ can be selected from known glasses.

As the glass forming the glass substrate 10 there is preferably used quartz glass, borosilicate glass, aluminosilicate glass, soda-lime glass, titanium-containing silicate glass, or alkali-free glass. When any of these glasses is employed, the absorption coefficient of the glass substrate 10 at the wavelength λ is at least 0.1 cm$^{-1}$.

To increase the absorption coefficient of the glass substrate 10 at the wavelength λ, the glass forming the glass substrate 10 may contain, as a coloring component, at least one oxide of a metal selected from the group consisting of Bi (bismuth), W (tungsten), Mo (molybdenum), Ce (cerium), Co (cobalt), Fe (iron), Mn (manganese), Cr (chromium), V (vanadium), Zn (zinc), Cu (copper), and Ti (titanium). The glass may further contain, if necessary, a metal oxide which functions as a coloring component other than those mentioned above.

When the glass forming the glass substrate 10 is borosilicate glass, #7059 or Pyrex (registered trademark) available from Corning Incorporated can be used.

When the glass forming the glass substrate 10 is aluminosilicate glass, a glass composition having the following composition may be used.

A glass composition containing, in mass %:
58 to 66% $SiO_2$;
13 to 19% $Al_2O_3$;
3 to 4.5% $Li_2O$;
6 to 13% $Na_2O$;
0 to 5% $K_2O$,
10 to 18% $R_2O$, where $R_2O=Li_2O+Na_2O+K_2O$;
0 to 3.5% MgO;
1 to 7% CaO;
0 to 2% SrO;
0 to 2% BaO;
2 to 10% RO, where RO=MgO+CaO+SrO+BaO;
0 to 2% $TiO_2$;
0 to 2% $CeO_2$;
0 to 2% $Fe_2O_3$;
0 to 1% MnO; and
0.05 to 0.5% $SO_3$,
wherein $TiO_2+CeO_2+Fe_2O_3+MnO=0.01$ to 3%.

A glass composition having the following composition may also be used.

A glass composition containing, in mass %:
60 to 70% $SiO_2$;
5 to 20% $Al_2O_3$;
5 to 25% $Li_2O+Na_2O+K_2O$;
0 to 1% $Li_2O$;
3 to 18% $Na_2O$;
0 to 9% $K_2O$;
5 to 20% MgO+CaO+SrO+BaO;
0 to 10% MgO;
1 to 15% CaO;
0 to 4.5% SrO;
0 to 1% BaO;
0 to 1% $TiO_2$; and
0 to 1% $ZrO_2$.

A glass composition having the following composition may also be used.

A glass composition containing, in mass %:
59 to 68% $SiO_2$;
9.5 to 15% $Al_2O_3$;
0 to 1% $Li_2O$;
3 to 18% $Na_2O$;
0 to 3.5% $K_2O$;
0 to 15% MgO;
1 to 15% CaO;
0 to 4.5% SrO;
0 to 1% BaO;
0 to 2% $TiO_2$; and
1 to 10% $ZrO_2$.

The following glass composition can also be used.
A glass composition containing, in mass %:
50 to 70% $SiO_2$;
14 to 28% $Al_2O_3$;
1 to 5% $Na_2O$;
1 to 13% MgO; and
0 to 14% ZnO.

The following glass composition may also be used.
A glass composition containing, in mass %:
56 to 70% $SiO_2$;
7 to 17% $Al_2O_3$;
4 to 8% $Li_2O$;
1 to 11% MgO;
4 to 12% ZnO;
14 to 23% $Li_2O$+MgO+ZnO;
0 to 9% $B_2O_3$;
0 to 3% CaO+BaO; and
0 to 2% $TiO_2$.

When the glass forming the glass substrate 10 is soda-lime glass, for example, any of glass compositions widely used for glass sheets can be employed.

When the glass forming the glass substrate 10 is titanium-containing silicate glass, for example, the absorption coefficient of the glass substrate 10 at the wavelength λ can be increased to 1 or more by increasing the $TiO_2$ content to 5 mol % or more, and the absorption coefficient of the glass substrate 10 at the wavelength λ can be increased to 4 or more by increasing the $TiO_2$ content to 10 mol % or more. The glass may further contain, if necessary, a metal oxide as mentioned above which functions as a coloring component.

When the glass forming the glass substrate 10 is titanium-containing silicate glass, for example, the following glass composition can be used.

A glass composition in which the following relationships are satisfied:

$$50 \leq (SiO_2+B_2O_3) \leq 79 \text{ mol \%};$$

$$5 \leq (Al_2O_3+TiO_2) \leq 25 \text{ mol \%};$$

$$5 \leq (Li_2O+Na_2O+K_2O+Rb_2O+Cs_2O+MgO+CaO+ \\ SrO+BaO) \leq 25 \text{ mol \%; and}$$

$$5 \leq TiO_2 \leq 25 \text{ mol \%}.$$

For the above titanium-containing silicate glass, it is preferable that the relationship $(Al_2O_3+TiO_2)/(Li_2O+Na_2O+K_2O+Rb_2O+Cs_2O+MgO+CaO+SrO+BaO) \leq 0.9$ be satisfied.

For the above titanium-containing silicate glass, it is preferable that the following relationships be satisfied:

$$70 \leq (SiO_2+B_2O_3) \leq 79 \text{ mol \%};$$

$$10 \leq TiO_2 \leq 15 \text{ mol \%; and}$$

$$10 \leq Na_2O \leq 15 \text{ mol \%}.$$

It is also preferable for the above titanium-containing silicate glass to have a thermal expansion coefficient of $100 \times 10^{-7}$ °C.$^{-1}$ or less.

When the glass forming the glass substrate 10 is alkali-free glass, for example, the following glass composition can be used.

A glass composition in which the following relationships are satisfied:

$$45 \leq (SiO_2+B_2O_3) \leq 80 \text{ mol \%};$$

$$7 \leq Al_2O_3 \leq 15 \text{ mol \%};$$

$0 \leq TiO_2 \leq 5$ mol %; and $2 \leq (MgO+CaO+SrO+BaO) \leq 20$ mol %, the glass composition being substantially free of any alkali metal oxide.

If the glass substrate 10 is to be used as an interposer, it is important to reduce the dielectric loss at high frequencies to improve the signal transmission characteristics. When a high-frequency voltage is applied to a glass substrate, the resulting power loss is proportional to the relative permittivity εr multiplied by the dielectric loss tangent tan δ. It is therefore preferable for the glass substrate 10 to be formed of glass having a relative permittivity εr of 11 or less and a dielectric loss tangent tan δ of 0.012 or less at a frequency of 1 GHz. In this case, it is more preferable that the relative permittivity εr of the glass forming the glass substrate 10 be 6 or less at 1 GHz. It is more preferable that the dielectric loss tangent tan δ of the glass forming the glass substrate 10 be 0.008 or less at 1 GHz.

The glass suitable for forming the glass substrate 10 to be used as an interposer is not particularly limited, as long as the glass has a relative permittivity εr of 11 or less and a dielectric loss tangent tan δ of 0.012 or less at a frequency of 1 GHz. Examples of the glass suitable for forming the glass substrate 10 to be used as an interposer include glasses listed in Table 1. The relative permittivity εr and dielectric loss tangent tan δ at a frequency of 1 GHz can be measured by cavity resonator perturbation. The cavity resonator perturbation is a method in which a change in resonant frequency of a material caused by insertion of a tiny dielectric or magnetic substance into a resonator is measured, and then the complex permittivity or complex magnetic permeability of the material is calculated using a perturbation technique. The measurement of the relative permittivity εr and dielectric loss tangent tan δ of the glasses listed in Table 1 was performed using a cavity resonator for 1 GHz and a network analyzer (E8361A, manufactured by Agilent Technologies) at 25° C.

The absorption coefficient can be calculated by measuring the transmittance and reflectance of a glass sample having a thickness d (e.g., d=about 0.1 cm). First, the transmittance T (%) and the reflectance R (%) at an incident angle of 12° are measured for the glass sample having a thickness d (cm). The transmittance T and reflectance R can be measured using UV-3100, a spectrophotometer manufactured by Shimadzu Corporation. The absorption coefficient α of the glass can be calculated from the measured values using the following equation.

$$\alpha = \ln((100-R)/T)/d$$

The focal length F (mm) of the lens is, for example, 50 mm to 500 mm and preferably 100 mm to 200 mm.

The beam diameter D (mm) of the pulsed laser is, for example, 1 mm to 40 mm and preferably 3 mm to 20 mm. The beam diameter D as defined herein refers to the diameter of the pulsed laser beam incident on the lens, and refers to the diameter at which the beam intensity drops to $[1/e^2]$ times the beam intensity at the center of the beam.

A value obtained by dividing the focal length F by the beam diameter D, i.e., the value of [F/D], is 7 or more, preferably 7 or more and 40 or less, and more preferably 10 or more and 20 or less. This value is associated with the degree of focusing of laser beams with which the glass is to be irradiated. When the F/D is 7 or more, the generation of an excessively high laser power in the vicinity of the beam waist can be prevented so that the occurrence of cracks inside the glass substrate 10 can be prevented.

It is unnecessary, before irradiation of the glass substrate 10 with the laser beams L, to subject the glass substrate 10 to a pretreatment such as formation of a film for promoting the absorption of the laser beams L. Depending on the situation, such a pretreatment may be carried out.

As shown in (a) of FIG. 1, the modified portions 12 are formed in the areas of the glass substrate 10 that have been irradiated with the laser beams L. The modified portions 12 can be distinguished from the rest of the glass substrate 10 typically by observation with an optical microscope. The

TABLE 1

| | | No. 1 | No. 2 | No. 3 | No. 4 | No. 5 | No. 6 | No. 7 |
|---|---|---|---|---|---|---|---|---|
| Composition [mol %] | $SiO_2$ | 60.00 | 37.50 | 81.00 | 66.60 | 66.27 | 65.95 | 70.40 |
| | $B_2O_3$ | 10.00 | 12.50 | 13.00 | 10.80 | 6.32 | 1.68 | |
| | $Al_2O_3$ | | | 2.00 | 10.93 | 12.00 | 14.48 | 0.86 |
| | ZnO | | | | | 5.85 | 8.24 | |
| | MgO | | | | 2.80 | 4.27 | 6.82 | 5.96 |
| | CaO | | | | 6.56 | | | 9.45 |
| | SrO | | | | 1.67 | | | |
| | BaO | | | | 0.29 | | | |
| | $Li_2O$ | | | | | 5.20 | | |
| | $Na_2O$ | 15.00 | 25.00 | 4.00 | 0.06 | | 2.73 | 12.57 |
| | $K_2O$ | | | | 0.17 | | | 0.52 |
| | $SnO_2$ | | | | 0.09 | 0.09 | 0.09 | |
| | $Fe_2O_3$ | | | | 0.04 | | | 0.03 |
| | $TiO_2$ | 15.00 | 25.00 | | | | | 0.02 |
| Relative permittivity εr | | 8.09 | 10.46 | 4.44 | 5.09 | 5.36 | 5.83 | 6.73 |
| Dielectric loss tangent tan δ | | 0.0082 | 0.0073 | 0.0054 | 0.0037 | 0.0081 | 0.0110 | 0.0082 |

The higher the rigidity of the glass forming the glass substrate 10 is, the less likely the upper and lower surfaces of the glass substrate 10 are to be cracked by irradiation with the laser beams L. Thus, for example, it is preferable that the Young's modulus of the glass forming the glass substrate 10 be 80 GPa or more.

modified portions 12 include: portions with defects such as E' center and non-bridging oxygen which have resulted from photochemical reaction induced by laser irradiation; and portions with a sparse glass structure generated at a high temperature due to rapid heating during laser irradiation and maintained due to rapid cooling after laser irradiation. The modified portions 12 are easier to etch with a predetermined etchant than the intact portion of the glass substrate 10.

In the modified portion forming step, for example, the glass substrate 10 is irradiated with the laser beams L that are focused on points within the glass substrate 10. The modified portions 12 are formed to facilitate the formation of through holes in the glass substrate 10 in the through hole forming step. To this end, the laser beams L are focused, for example, on points at or in the vicinity of the thickness center of the glass substrate 10 when applied to the glass substrate 10. The laser beams L may be focused on points outside the glass substrate 10 when applied to the glass substrate 10, as long as the modified portions 12 can be formed in the glass substrate 10. For example, when applied to the glass substrate 10, the laser beams L may be focused on points at a predetermined distance (e.g., 1.0 mm) from the surface of the glass substrate 10 on which the laser beams L are incident, or the laser beams L may be focused on points at a predetermined distance (e.g., 1.0 mm) from the surface of the glass substrate 10 opposite to that on which the laser beams L are incident. That is, as long as the modified portions 12 can be formed in the glass substrate 10, the laser beams L may be focused on points within a distance of 1.0 mm from the laser beam L-incident surface of the glass substrate 10 in a direction opposite to the traveling direction of the laser beams L (the points including those on the laser beam L-incident surface of the glass substrate 10), or may be focused on points within a distance of 1.0 mm from the surface of the glass substrate 10 opposite to the laser beam L-incident surface in the direction in which the laser beams L having passed through the glass substrate 10 travel (the points including those on the surface of the glass substrate 10 opposite to the laser beam L-incident surface), or may be focused on points within the glass substrate 10.

The size of the modified portions 12 varies depending on, for example, the beam diameter D of the laser beams L incident on the lens, the focal length F of the lens, the absorption coefficient of the glass forming the glass substrate 10, and the power of the pulsed laser. Adjusting these parameters makes it possible, for example, to form the modified portions 12 in the shape of a cylinder having a diameter of 10 μm or less and having a length of 100 μm or more in the thickness direction of the glass substrate 10.

Examples of the conditions employed in the modified portion forming step are listed in Table 2.

TABLE 2

| | Conditions | Range |
|---|---|---|
| | Absorption coefficient of glass [cm$^{-1}$] | 0.1 to 20 |
| Laser beam L | Pulse width [ns] | 5 to 50 |
| | Wavelength [nm] | 350 to 360 |
| | Beam diameter D [mm] | 3 to 20 |
| | Energy [μJ/pulse] | 5 to 100 |
| | Focal length of lens F [mm] | 100 to 200 |

In the modified portion forming step, the modified portions 12 may be formed to extend in the thickness direction of the glass substrate 10 from the first principal surface of the glass substrate 10 to a second principal surface of the glass substrate 10 opposite to the first principal surface, as shown in (a) of FIG. 1. That is, in the modified portion forming step, the modified portions 12 are formed to be exposed both at the first principal surface of the glass substrate 10 and at the second principal surface of the glass substrate 10. In this case, the glass substrate 10 need not be ground to expose the modified portions 12 to the outside before the through hole forming step. In addition, the predetermined etchant can come into contact with the modified portions 12 in a region near the second principal surface of the glass substrate 10 from the beginning of the through hole forming step, and this allows the through holes 14 to be formed in the glass substrate 10 relatively quickly.

Hereinafter, the first conductive portion forming step will be described. As shown in (b) of FIG. 1, the first conductive portions 20a are formed on the first principal surface of the glass substrate 10 so as to be positioned in correspondence with the modified portions 12 in the glass substrate 10. Specifically, in the first conductive portion forming step, the first conductive portions 20a are formed in such a manner that a part of each first conductive portion 20a overlaps the corresponding one of the modified portions 12 when the glass substrate 10 is viewed in plan. The positions of the modified portions 12 in the glass substrate 10 are those where through glass vias 30 are to be finally formed as shown in (e) of FIG. 1. Thus, to achieve reliable electrical connection between the through glass vias 30 and the first conductive portions 20a, it is preferable to form the first conductive portions 20a on the first principal surface of the glass substrate 10 in such a manner that a part of each first conductive portion 20a is situated directly above the corresponding one of the modified portions 12.

Figure 2:
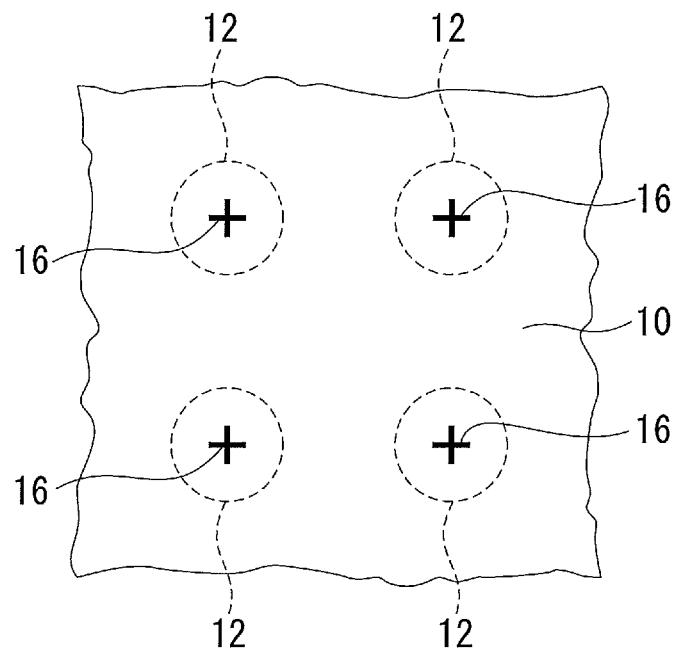
FIG. 2 is a plan view of a glass substrate for producing the glass substrate with through glass vias.

As described above, the formation of the first conductive portions 20a must be done in such a manner that the first conductive portions 20a are arranged on the first principal surface of the glass substrate 10 in a predetermined positional relationship with respect to the modified portions 12 in the glass substrate 10. The first conductive portion forming step thus requires exact knowledge of the positions of the modified portions 12 in the glass substrate 10. However, it may be difficult to distinguish the modified portions 12 from the areas of the glass substrate 10 other than the modified portions 12. In view of this, it is advantageous, for example, that the glass substrate 10 for producing a glass substrate with through glass vias include, as shown in FIG. 2, the modified portions 12 and positioning elements 16 for positional adjustment between the modified portions 12 and the conductive portions (first conductive portions 20a) to be formed on the first principal surface of the glass substrate 10. The modified portions 12 are formed by laser irradiation of the glass substrate 10, as previously described. The positioning elements 16 are, for example, marks formed on the first principal surface of the glass substrate 10 so as to be located directly above the modified portions 12 as shown in FIG. 2. Alternatively, the positioning elements 16 may be marks formed on the first principal surface of the glass substrate 10 in such a manner that each mark is located at a predetermined distance from the point directly above the corresponding one of the modified portions 12. The positioning elements 16 are not particularly limited, as long as they can be used for positional adjustment between the modified portions 12 and the conductive portions (first conductive portions 20a) to be formed on the first principal surface of the glass substrate 10.

In the above case, the method for producing a glass substrate with through glass vias according to the first embodiment further includes a positioning element forming step of, after the modified portion forming step and before the first conductive portion forming step or before the modified portion forming step, forming the positioning elements 16 for positional adjustment between the modified portions 12 and the first conductive portions 20a to be formed in the first conductive portion forming step.

The positioning elements 16 may not be formed, if the modified portions 12 are easy to distinguish from the areas of the glass substrate 10 other than the modified portions 12. In this case, some of the modified portions formed, or the modified portions in which no through holes are to be formed, may be used as the positioning elements 16 for positional adjustment between the modified portions 12 and the first conductive portions 20*a*.

The formation of the first conductive portions 20*a* is done after confirmation of the positions of the modified portions 12 in the glass substrate 10. The method for forming the first conductive portions 20*a* is not particularly limited. The formation of the first conductive portions 20*a* can be accomplished, for example, by sputtering or vapor-depositing a metal material such as Cu (copper) onto the first principal surface of the glass substrate 10, with the first principal surface of the glass substrate 10 being masked except for the areas where the first conductive portions 20*a* are to be formed. Alternatively, the entirety of the first principal surface of the glass substrate 10 may be plated to form a thin metal layer on the first principal surface, and then unnecessary areas of the thin metal layer may be removed by photolithography to form the first conductive portions 20*a*. The first conductive portions 20*a* may be formed also by depositing a conductive ink onto the first principal surface of the glass substrate 10 using an inkjet. The first conductive portions 20*a* function, for example, as a circuit pattern or electrodes in the resulting glass substrate with through glass vias. Since the first conductive portions 20*a* are formed before formation of the through holes 14 as described above, the glass substrate 10 has a high mechanical strength during the first conductive portion forming step. The handling of the glass substrate 10 is thus easy during the formation of the conductive portions on the glass substrate 10.

The method for producing a glass substrate with through glass vias according to the first embodiment may further include a protective coating forming step as illustrated in (c) of FIG. 1. The protective coating forming step is a step of forming a protective coating 22 on the surfaces of the first conductive portions 20*a* before the through hole forming step, the protective coating 22 being adapted to protect the first conductive portions 20*a* from the etchant to be used in the through hole forming step. The protective coating 22 is preferably a peelable film that can be removed after the through hole forming step. The protective coating 22 used can be, for example, a silicone resin having etching resistance or a film having etching resistance. The protective coating forming step can be skipped depending on the situation.

Next, the through hole forming step will be described. The through hole forming step is performed after the first conductive portion forming step. The through hole forming step uses an etchant that etches the modified portions 12 at an etching rate higher than an etching rate at which the etchant etches areas of the glass substrate 10 where the modified portions 12 are not formed. That is, the through hole forming step is accomplished by wet etching. The etchant used can be, for example, hydrofluoric acid (an aqueous solution of hydrogen fluoride (HF)). Alternatively, sulfuric acid ($H_2SO_4$), an aqueous solution of sulfuric acid, nitric acid ($HNO_3$), an aqueous solution of nitric acid, or hydrochloric acid (an aqueous solution of hydrogen chloride (HCl)) may be used. A mixture of these acids may also be used. When hydrofluoric acid is used as the etchant, the etching of the modified portions 12 readily proceeds, and thus the through holes 14 can be quickly formed. When sulfuric acid is used as the etchant, the glass in the areas other than the modified portions 12 is slow to be etched, and thus the through holes 14 can be formed as straight holes with a narrow cone angle.

The etching time and the temperature of the etchant are selected as appropriate depending on the shape and size of the modified portions 12. The etching rate can be enhanced by increasing the temperature of the etchant used for the etching. The diameter of the through holes 14 can be controlled by adjusting the etching conditions.

The etching is performed from the principal surface of the glass substrate 10 opposite to the principal surface having the first conductive portions 20*a* formed thereon. There is a difference between the etching rate in the modified portions 12 and the etching rate in areas of the glass substrate 10 other than the modified portions 12, so that the modified portions 12 extending in the thickness direction of the glass substrate 10 are etched at a rate higher than a rate at which the thickness of the glass substrate 10 decreases due to the etching. Consequently, as shown in (d) of FIG. 1, the through holes 14 are formed in the glass substrate 10 at the positions of the modified portions 12. The first conductive portions 20*a* are not eroded by the etchant. The etching stops at the interface between the glass substrate 10 and the first conductive portions 20*a*. This prevents damage to the first conductive portions 20*a* formed on the glass substrate 10.

Next, the through glass via forming step will be described. The method for forming the through glass vias 30 is not particularly limited, as long as the through glass vias 30 can be formed inside the through holes 14. For example, plating with a metal such as Cu (copper) can be employed to form the through glass vias 30 inside the through holes 14. Direct plating on the glass substrate 10 is difficult. Thus, for example, seed layers, on which a conductive material for forming the through glass vias 30 is to be deposited, are first formed at least on the inner peripheral surfaces of the through holes 14, and then the through glass vias 30 are formed by plating. The seed layers can be formed by bringing a catalyst containing, for example, Pd (palladium) into contact with the surfaces, including the inner peripheral surfaces of the through holes 14, of the glass substrate 10. In this manner, the glass substrate 10 can be electroless-plated. The metal for plating the glass substrate 10 is not particularly limited. In terms of increasing the electrical conductivity and reducing the production cost, the metal is preferably Cu (copper). The plating is performed on the principal surface of the glass substrate 10 opposite to the principal surface having the first conductive portions 20*a* formed thereon and on the inner peripheral surfaces of the through holes 14. The electroless plating results in the formation of a metal layer 32 having a predetermined thickness on the principal surface of the glass substrate 10 opposite to the principal surface having the first conductive portions 20*a* formed thereon, thus providing electrical conductivity to the side of the glass substrate 10 remote from the first conductive portions 20*a*. In this case, electrolytic plating may be performed to accomplish efficient plating. That is, the glass substrate 10 may be plated by a combination of electroless plating and electrolytic plating.

The metal layer 32, which has been formed by plating on the principal surface of the glass substrate 10 opposite to the principal surface having the first conductive portions 20*a* formed thereon, may be removed as shown in (0 of FIG. 1, for example, by grinding. Additionally, for example, second conductive portions 20*b* are formed on the principal surface of the glass substrate 10 opposite to the principal surface having the first conductive portions 20*a* formed thereon, as shown in (g) of FIG. 1. The protective coating 22 is removed at this stage. The second conductive portions 20*b* can be formed by a method identical to that described above as a method for forming the first conductive portions 20a. The method for forming the first conductive portions 20a and the method for forming the second conductive portions 20b may differ from each other. As thus far described, the method for forming a glass substrate with through glass vias according to the first embodiment may further include a second conductive portion forming step of forming the second conductive portions 20b on the second principal surface of the glass substrate 10 opposite to the first principal surface of the glass substrate 10. In the foregoing manner, a glass substrate 1a with through glass vias can be produced.

The second conductive portions 20b may, as shown in (h) of FIG. 1, be formed by partially removing the metal layer 32 formed by plating on the principal surface of the glass substrate 10 opposite to the principal surface having the first conductive portions 20a formed thereon. For example, the metal layer, which has been formed by plating on the principal surface of the glass substrate 10 opposite to the principal surface having the first conductive portions 20a formed thereon, is subjected to photolithography that allows areas of the metal layer which are necessary as the second conductive portions 20b to remain while removing unnecessary areas of the metal layer. In this case, the removal of the protective coating 22 can be done together with resist removal. In this manner, a glass substrate 1b with through glass vias can be produced.

Figure 3:
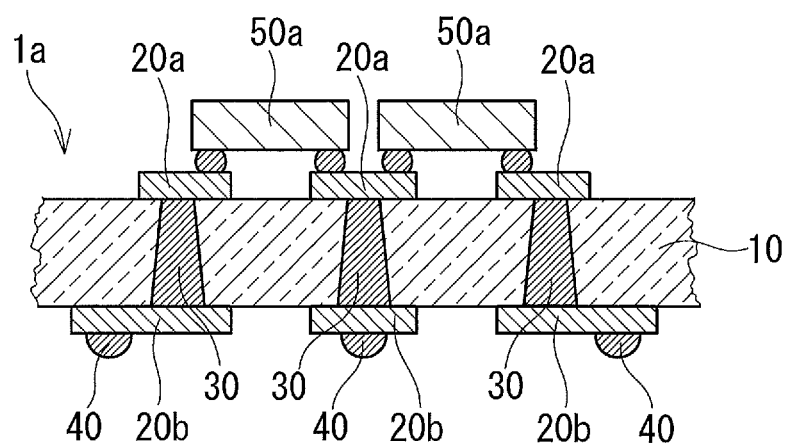
FIG. 3 is a cross-sectional view showing an example where the glass substrate with through glass vias is used as an interposer.

The glass substrate 1a with through glass vias or glass substrate 1b with through glass vias is obtained in the manner as described above. The glass substrate 1a with through glass vias can be used, for example, as an interposer as shown in FIG. 3. For example, the first conductive portions 20a are electrically connected to electronic devices 50a such as ICs, light-receiving elements, and light-emitting elements, while the second conductive portions 20b are electrically connected to a printed circuit board (not shown) through solder balls 40 or other means.

Second Embodiment

Hereinafter, the method for producing a glass substrate with through glass vias according to the second embodiment will be described. The method for producing a glass substrate with through glass vias according to the second embodiment is performed in the same manner as the method for producing a glass substrate with through glass vias according to the first embodiment, unless otherwise described.

Figure 4:
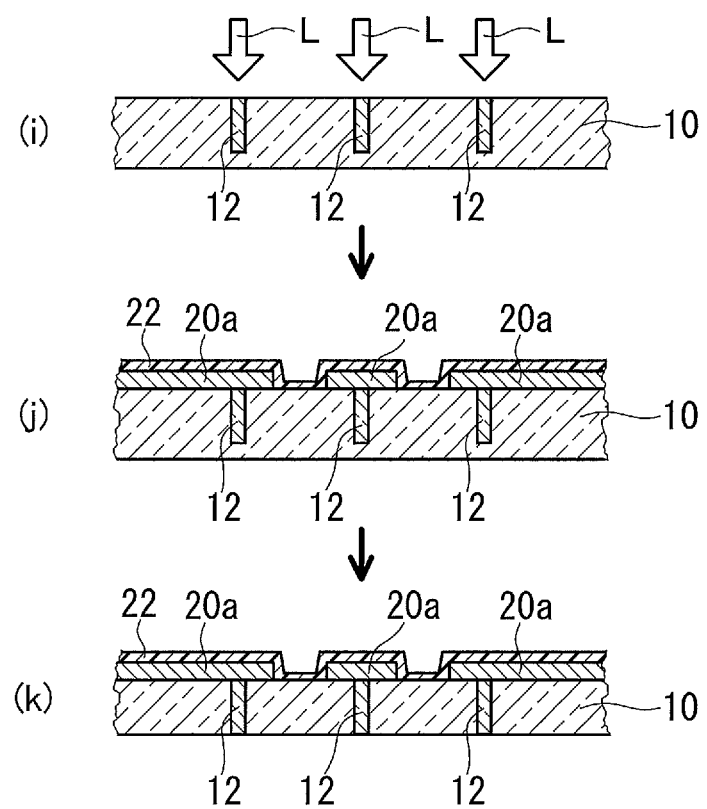
FIG. 4 shows cross-sectional views illustrating the steps of the method for producing a glass substrate with through glass vias according to the second embodiment.

In the modified portion forming step, the modified portions 12 are formed to extend in the thickness direction of the glass substrate 10 from within the glass substrate 10 to the first principal surface of the glass substrate 10, as shown in (i) of FIG. 4. That is, the modified portions 12 are formed to be exposed at the first principal surface of the glass substrate 10. The first principal surface of the glass substrate 10 is the principal surface on which the first conductive portions 20a are to be formed. In the modified portion forming step, the modified portions 12 are formed to be spaced in the thickness direction of the glass substrate 10 from the second principal surface of the glass substrate 10 opposite to the first principal surface of the glass substrate 10. That is, the modified portions 12 are formed so as not to be exposed at the second principal surface of the glass substrate 10.

Using the glass substrate 10 in which the modified portions 12 have been formed as above, the first conductive portions 20a are formed on the first principal surface of the glass substrate 10 so as to be positioned in correspondence with the modified portions 12, as shown in (j) of FIG. 4. The protective coating 22 may be formed on the surfaces of the first conductive portions 20a if necessary. After that, the modified portions 12 are exposed, as shown in (k) of FIG. 4, by grinding the second principal surface of the glass substrate 10 before the through hole forming step. That is, the method for producing a glass substrate with through glass vias according to the second embodiment further includes a grinding step of grinding the second principal surface of the glass substrate 10 to expose the modified portions to the outside of the glass substrate 10 before the through hole forming step.

The glass substrate 10 is subsequently processed according to the steps as illustrated in (d) to (h) of FIG. 1, and thus a glass substrate with through glass vias is produced. The formation of the modified portions 12 can require a long time, depending on the thickness of the glass substrate 10 or on the type of the glass forming the glass substrate 10. According to the present embodiment in which the modified portions 12 are formed so as not to extend through the thickness of the glass substrate 10, the formation of the modified portions 12 can be completed relatively quickly. In addition, the first conductive portions 20a can be formed on the glass substrate 10 whose second principal surface has yet to be ground. This means that the glass substrate 10 is relatively thick when subjected to the first conductive portion forming step. The handling of the glass substrate 10 is thus easy during the formation of the first conductive portions 20a. Furthermore, the thickness of the finally-produced glass substrate with through glass vias can be reduced.

Third Embodiment

Next, the method for producing a glass substrate with through glass vias according to the third embodiment will be described. The method for producing a glass substrate with through glass vias according to the third embodiment is performed in the same manner as the method for producing a glass substrate with through glass vias according to the second embodiment, unless otherwise described.

In the method for producing a glass substrate with through glass vias according to the third embodiment, the modified portions 12 are exposed at the second principal surface of the glass substrate 10 by etching the second principal surface of the glass substrate 10 rather than by grinding the second principal surface.

Figure 5:
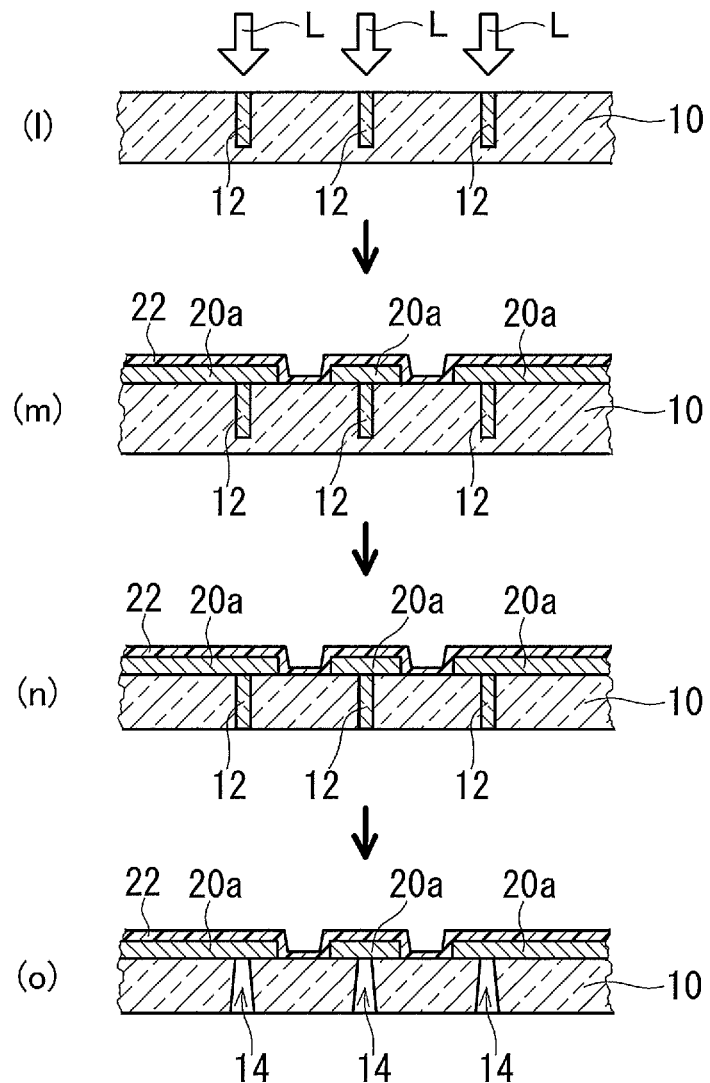
FIG. 5 shows cross-sectional views illustrating the steps of the method for producing a glass substrate with through glass vias according to the third embodiment.

In the modified portion forming step, the modified portions 12 are formed to extend in the thickness direction of the glass substrate 10 from within the glass substrate 10 to the first principal surface of the glass substrate 10, as shown in (1) of FIG. 5. That is, the modified portions 12 are formed to be exposed at the first principal surface of the glass substrate 10. The first principal surface of the glass substrate 10 is the principal surface on which the first conductive portions 20a are to be formed. In the modified portion forming step, the modified portions 12 are formed to be spaced in the thickness direction of the glass substrate from the second principal surface of the glass substrate 10 opposite to the first principal surface of the glass substrate 10.

The first conductive portions 20a are formed on the first principal surface of the glass substrate 10 so as to be positioned in correspondence with the modified portions 12, as shown in (m) of FIG. 5. The protective coating 22 may be formed on the surfaces of the first conductive portions 20a if necessary.

After that, the glass substrate 10 is dipped in an etchant in such a manner that the glass substrate 10 is wet-etched from the second principal surface of the glass substrate 10. At the beginning, the etching of the glass substrate 10 proceeds at a uniform etching rate over the entirety of the second principal surface of the glass substrate 10, since the modified portions 12 are not exposed at the second principal surface of the glass substrate 10. When the etching of the glass substrate 10 has progressed to a certain extent, the modified portions 12 are exposed at the second principal surface of the glass substrate 10 as shown in (n) of FIG. 5. The etchant used is an etchant that etches the modified portions 12 at an etching rate higher than an etching rate at which the etchant etches areas of the glass substrate 10 where the modified portions 12 are not formed. Thus, there is a difference between the etching rate in the modified portions 12 and the etching rate in the areas of the glass substrate 10 other than the modified portions 12, so that the modified portions 12 extending in the thickness direction of the glass substrate 10 are etched at a rate higher than a rate at which the thickness of the glass substrate 10 decreases due to the etching. This results in the formation of the through holes 14 as shown in (o) of FIG. 5.

The glass substrate 10 is subsequently processed according to the steps as illustrated in (e) to (h) of FIG. 1, and thus a glass substrate with through glass vias is produced. With the use of the method for producing a glass substrate with through glass vias according to the third embodiment, the grinding step performed to expose the modified portions 12 at the second principal surface of the glass substrate 10 can be skipped, and thus the production cost of glass substrates with through glass vias can be reduced. In addition, the first conductive portions 20a can be formed on the glass substrate 10 that has no through holes 14 formed therein and is relatively thick. The handling of the glass substrate 10 is thus easy during the formation of the first conductive portions 20a. Furthermore, the thickness of the finally-produced glass substrate with through glass vias can be reduced.

Fourth Embodiment

Next, the method for producing a glass substrate with through glass vias according to the fourth embodiment will be described. The method for producing a glass substrate with through glass vias according to the fourth embodiment is performed in the same manner as the method for producing a glass substrate with through glass vias according to the first embodiment, unless otherwise described.

Figure 6:
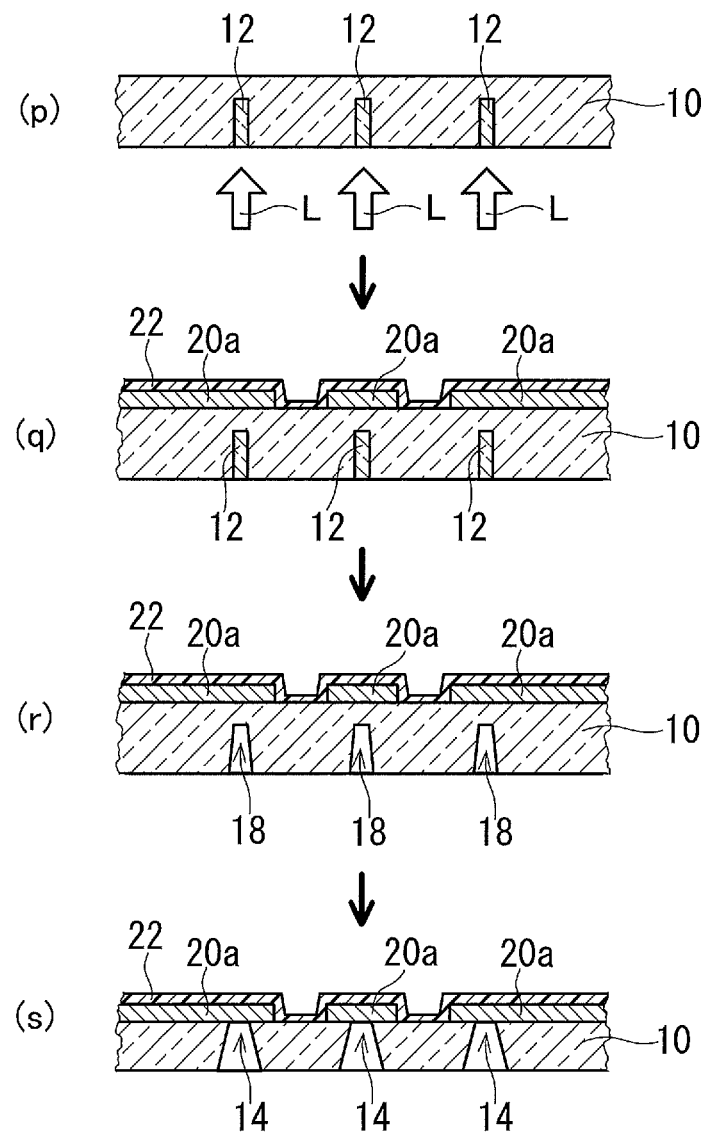
FIG. 6 shows cross-sectional views illustrating the steps of the method for producing a glass substrate with through glass vias according to the fourth embodiment.

In the modified portion forming step, the modified portions 12 are formed to extend in the thickness direction of the glass substrate 10 from within the glass substrate 10 to the second principal surface of the glass substrate 10, as shown in (p) of FIG. 6. That is, the modified portions 12 are formed to be exposed at the second principal surface of the glass substrate 10. The second principal surface of the glass substrate 10 is the principal surface of the glass substrate 10 opposite to the principal surface on which the first conductive portions 20a are to be formed. In the modified portion forming step, the modified portions 12 are formed to be spaced in the thickness direction of the glass substrate from the first principal surface of the glass substrate 10.

The first conductive portions 20a are formed on the first principal surface of the glass substrate 10 so as to be positioned in correspondence with the modified portions 12, as shown in (q) of FIG. 6. The protective coating 22 may be formed on the surfaces of the first conductive portions 20a if necessary.

After that, the glass substrate 10 is dipped in an etchant in such a manner that the glass substrate 10 is wet-etched from the second principal surface of the glass substrate 10. The etchant used is an etchant that etches the modified portions 12 at an etching rate higher than an etching rate at which the etchant etches areas of the glass substrate 10 where the modified portions 12 are not formed. Thus, there is a difference between the etching rate in the modified portions 12 and the etching rate in the areas of the glass substrate 10 other than the modified portions 12, so that the modified portions 12 extending in the thickness direction of the glass substrate 10 are etched at a rate higher than a rate at which the thickness of the glass substrate 10 decreases due to the etching. This results in the formation of bottomed holes 18 as shown in (r) of FIG. 6. After that, the etching of the glass substrate 10 proceeds at a uniform etching rate in the thickness direction of the glass substrate 10, and the through holes 14 are consequently formed as shown in (s) of FIG. 6.

Fifth Embodiment

Next, the method for producing a glass substrate with through glass vias according to the fifth embodiment will be described. The method for producing a glass substrate with through glass vias according to the fifth embodiment is performed in the same manner as the method for producing a glass substrate with through glass vias according to the first embodiment, unless otherwise described.

Figure 7:
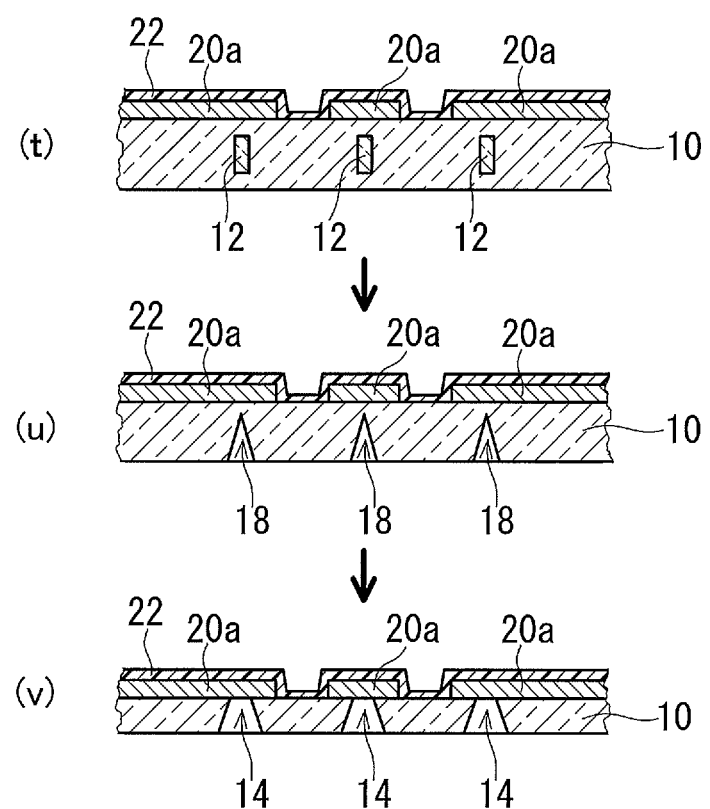
FIG. 7 shows cross-sectional views illustrating the steps of the method for producing a glass substrate with through glass vias according to the fifth embodiment.

As shown in (t) of FIG. 7, the modified portions 12 are formed to be spaced from the first principal surface and second principal surface of the glass substrate 10, and then the first conductive portions 20a are formed on the first principal surface of the glass substrate 10. That is, in the modified portion forming step, the modified portions 12 are formed to be spaced from the first principal surface and second principal surface of the glass substrate 10. The protective coating 22 may be formed on the surfaces of the first conductive portions 20a depending on the situation.

After that, the glass substrate 10 is dipped in an etchant in such a manner that the glass substrate 10 is wet-etched from the second principal surface of the glass substrate 10. At the beginning, as in the third embodiment, the etching of the glass substrate 10 proceeds at a uniform etching rate over the entirety of the second principal surface of the glass substrate 10. After the etching of the glass substrate 10 has progressed to such an extent that the modified portions 12 are exposed at the second principal surface of the glass substrate 10, the modified portions 12 extending in the thickness direction of the glass substrate 10 are etched at a rate higher than a rate at which the thickness of the glass substrate 10 decreases due to the etching, since there is a difference between the etching rate in the modified portions 12 and the etching rate in the areas of the glass substrate 10 other than the modified portions 12. The etching of the modified portions 12 results in the formation of the bottomed holes 18 as shown in (u) of FIG. 7. The etching further proceeds, so that the through holes 14 are formed as shown in (v) of FIG. 7.

According to the fifth embodiment, the length of the modified portions 12 in the thickness direction of the glass substrate 10 can be relatively short; that is, the formation of the modified portions 12 can be completed relatively quickly. The etching rate at which the etchant etches the areas of the glass substrate 10 other than the modified portions 12 is relatively low and, accordingly, the time from completion of the etching of the modified portions 12 to the formation of the through holes 14 is relatively long. Thus, the etching proceeds not only in the thickness direction but also in the plane direction of the glass substrate 10, with the result that the through holes 14 have an inner peripheral surface tapering at a wide cone angle as shown in (v) of FIG. 7. This may limit the achievable size of the through holes 14. It is therefore desirable that, in the modified portion forming step, the modified portions 12 be formed to be exposed at the first principal surface of the glass substrate 10.

The invention claimed is:

1. A substrate for producing through glass vias, comprising:
   a glass substrate;
   a modified portion formed by laser irradiation;
   a conductive portion that is formed on a first principal surface of the glass substrate; and
   a positioning element for positional adjustment between the modified portion and the conductive portion,
   wherein, a part of the conductive portion overlaps a part of the modified portion.

2. The substrate according to claim 1, wherein the glass substrate has a relative permittivity $\varepsilon r$ of 11 or less and a dielectric loss tangent $\tan \delta$ of 0.012 or less at a frequency of 1 GHz.

3. The substrate according to claim 1, wherein the glass substrate has a relative permittivity $\varepsilon r$ of 6 or less and a dielectric loss tangent $\tan \delta$ of 0.008 or less at a frequency of 1 GHz.

* * * * *